(12) United States Patent
Hill et al.

(10) Patent No.: US 6,974,983 B1
(45) Date of Patent: Dec. 13, 2005

(54) ISOLATED FINFET P-CHANNEL/N-CHANNEL TRANSISTOR PAIR

(75) Inventors: Wiley Eugene Hill, Moss Beach, CA (US); Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/768,660

(22) Filed: Feb. 2, 2004

(51) Int. Cl.[7] .................................. H01L 21/062
(52) U.S. Cl. ........................... 257/292; 257/657
(58) Field of Search ........................ 257/369, 401, 257/192, 243, 374

(56) References Cited

U.S. PATENT DOCUMENTS

| | | | |
|---|---|---|---|
| 6,580,137 B2 * | 6/2003 | Parke ......................... | 257/401 |
| 6,838,322 B2 * | 1/2005 | Pham et al. ................ | 438/151 |
| 2005/0001273 A1 * | 1/2005 | Bryant et al. .............. | 257/369 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—David Nelms
*Assistant Examiner*—Thinh T Nguyen
(74) *Attorney, Agent, or Firm*—Harrity & Snyder, LLP (57) ABSTRACT

A semiconductor device includes an N-channel device and a P-channel device. The N-channel device includes a first source region, a first drain region, a first fin structure, and a gate. The P-channel device includes a second source region, a second drain region, a second fin structure, and the gate. The second source region, the second drain region, and the second fin structure are separated from the first source region, the first drain region, and the first fin structure by a channel stop layer.

17 Claims, 13 Drawing Sheets

ISOLATED FINFET P-CHANNEL/N-CHANNEL TRANSISTOR PAIR

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention merge N-channel and P-channel FinFET devices on a single fin structure. As a result, a maximum density for complimentary FinFET structures can be achieved.

In accordance with the purpose of this invention as embodied and broadly described herein, a semiconductor device includes a fin structure that includes a semiconducting material and a channel stop layer. The semiconductor device further includes a source region formed at one end of the fin structure, the channel stop layer separating the source region into a first source region and second source region. The semiconductor device also includes a drain region formed at an opposite end of the fin structure, the channel stop layer separating the drain region into a first drain region and second drain region. The semiconductor device further includes at least one gate.

In another implementation consistent with the present invention, a semiconductor device includes a fin structure that includes a retrograde channel stop layer that extends a length of the fin structure and positioned approximately in a center of the fin structure. The semiconductor device further includes a source region formed at one end of the fin structure, the retrograde channel stop layer separating the source region into a first source region and second source region. The semiconductor device also includes a drain region formed at an opposite end of the fin structure, the retrograde channel stop layer separating the drain region into a first drain region and second drain region.

In yet another implementation consistent with the principles of the invention, a semiconductor device includes an N-channel device including a first source region, a first drain region, a first fin structure, and a gate. The semiconductor device further includes a P-channel device including a second source region, a second drain region, a second fin structure. The gate, the second source region, the second drain region, and the second fin structure are separated from the first source region, the first drain region, and the first fin structure by a channel stop layer.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention form multiple transistors in small amounts of space to achieve increased transistor density.

EXEMPLARY PROCESSING

Figure 1:
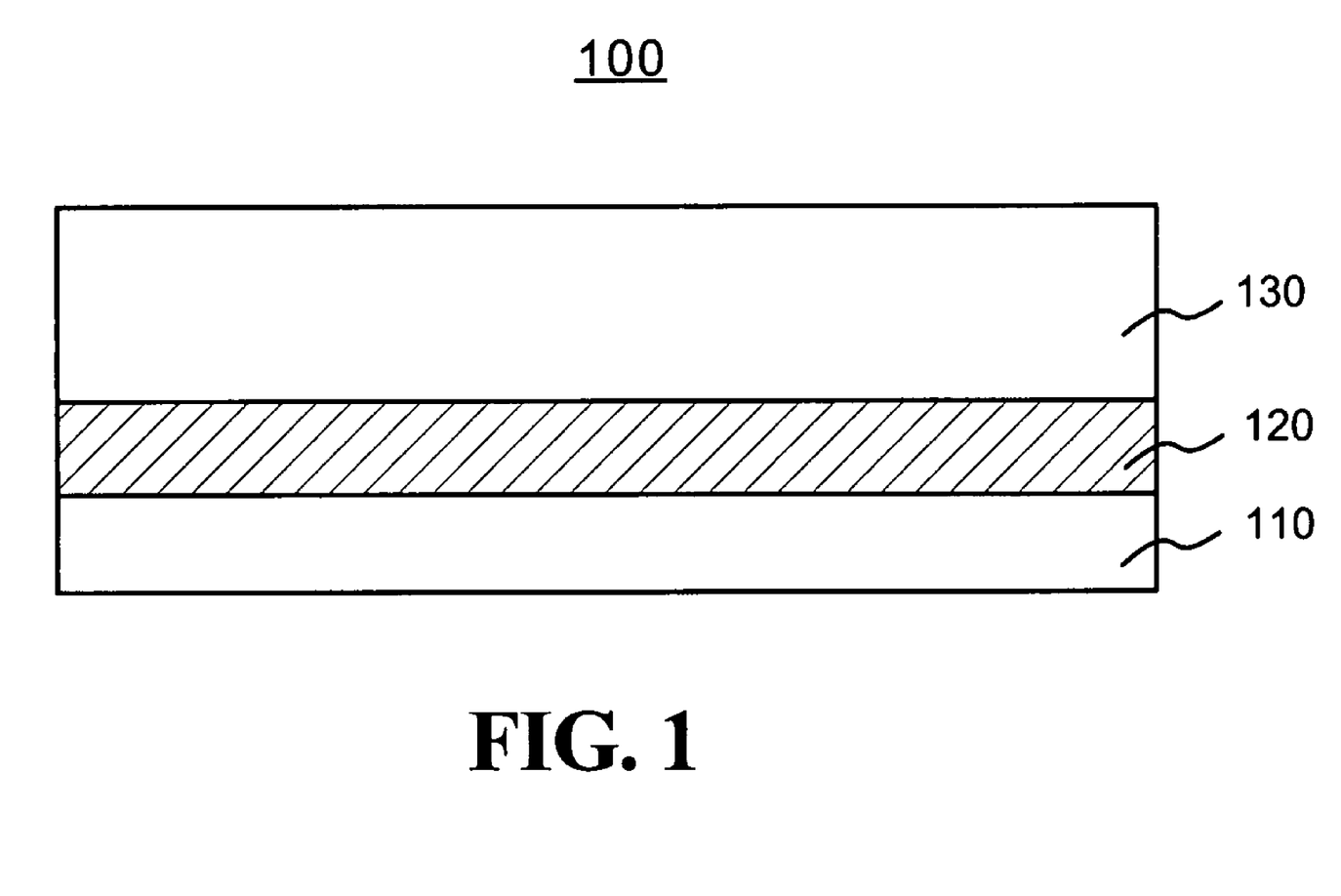
FIGS. 1–10 illustrate exemplary views of a merged N-channel/P-channel FinFET device fabrication process consistent with the principles of the invention.

FIG. 1 illustrates an exemplary semiconductor device 100 that includes a silicon-on-insulator (SOI) structure having a silicon substrate 110, a buried oxide layer 120, and a silicon layer 130 on buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1500 Å to about 3000 Å. Silicon layer 130 may include monocrystalline or polycrystalline silicon having a thickness ranging from about 200 Å to about 1000 Å. Silicon layer 130 may be used to form a fin structure, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

Figure 2:
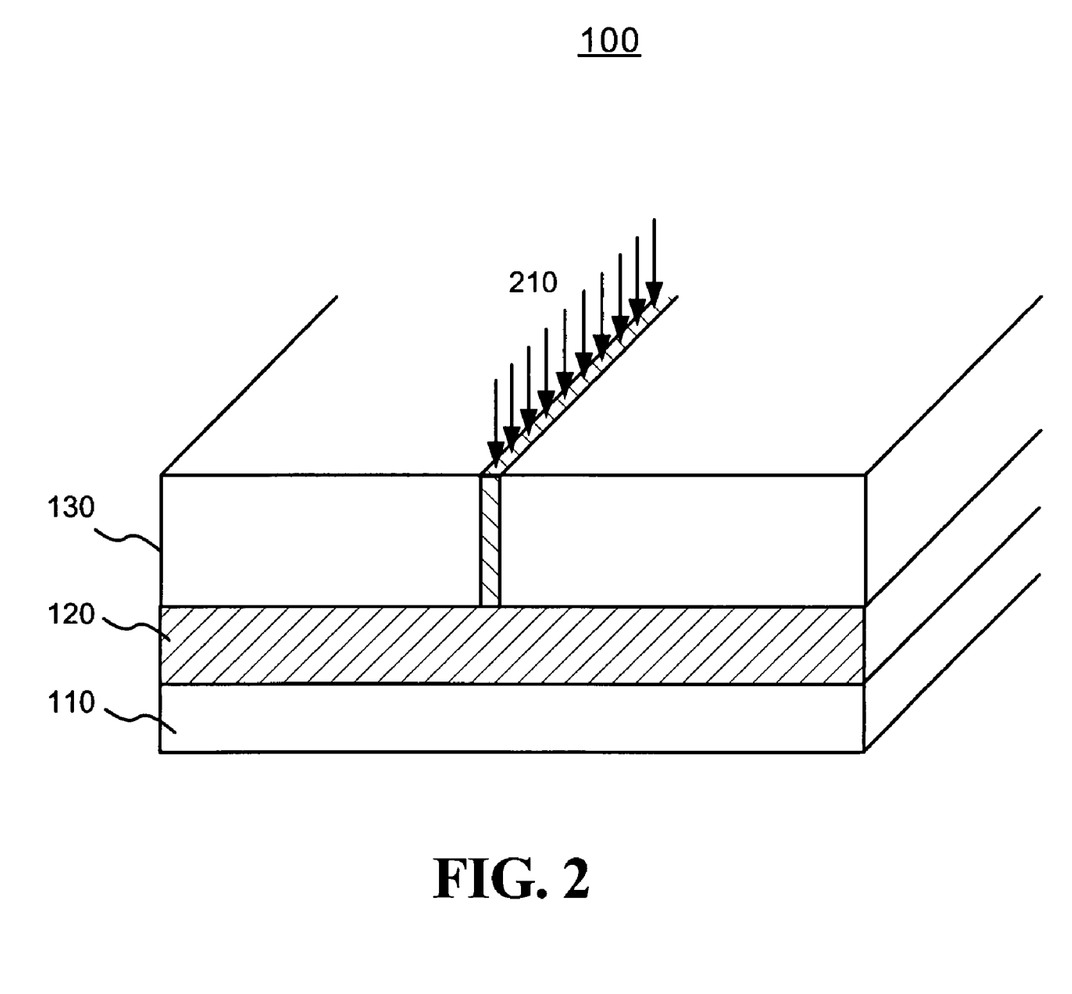

A retrograde channel stop layer 210 may be implanted into layer 130, as illustrated in FIG. 2. Retrograde channel stop layer 210 may include ions implanted at selected concentrations and implantation energy levels. In one implementation, for example, Boron or Phosphorus Ions having a selected concentration in the range of $10^{16}$–$10^{17}$ ions per $cm^2$ may be implanted at a selected implantation energy in the range of 5–40 KeV. Retrograde channel stop layer creates a retrograde channel profile in which the peak concentration of implanted ions is below the surface. The retrograde channel concentration profile of channel stop layer 210 may confine a depletion region of a P/N junction that may be formed between a portion of layer 130 on one side of channel stop 210 and a portion of layer 130 on another side of channel stop layer 210.

Figure 3:
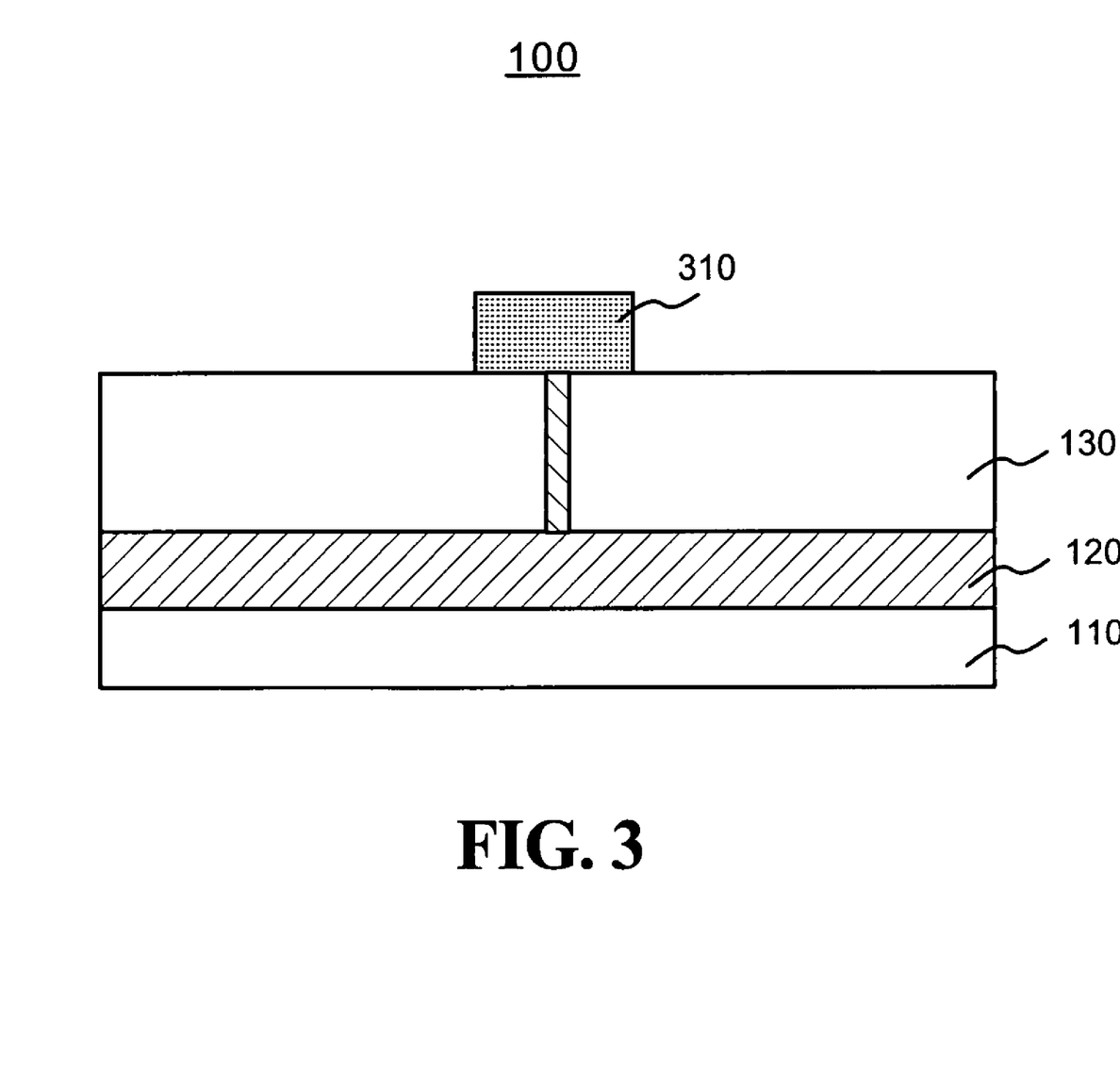
Figure 4A:
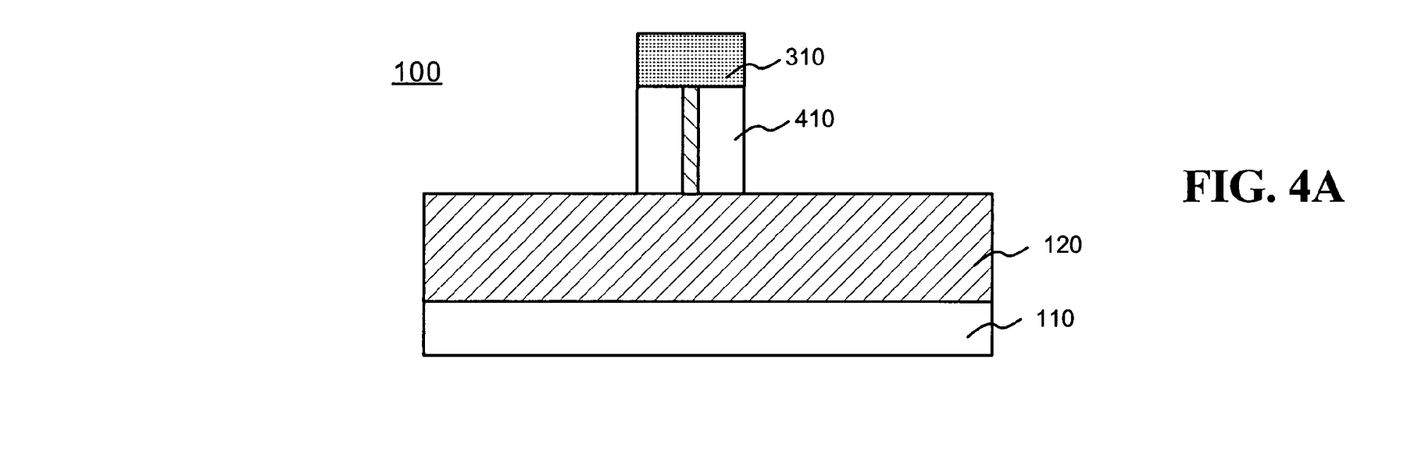
Figure 4B:
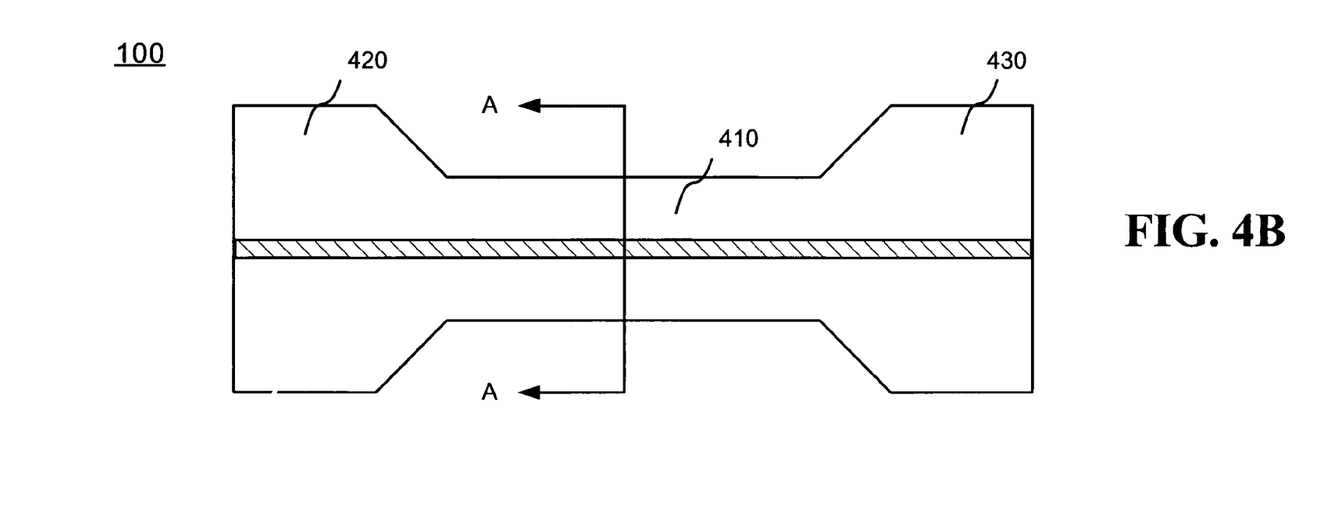

A photoresist material may be deposited and patterned to form a photoresist mask 310, as illustrated in FIG. 3. The photoresist material may be deposited and patterned in any conventional manner. Semiconductor device 100 may then be etched to form a fin structure 410, as illustrated in FIGS. 4A & 4B. In an exemplary implementation, silicon layer 130 may be etched in a conventional manner, with the etching terminating on buried oxide layer 120. The portion of silicon layer 130 located under photoresist mask 310 will not be etched, thereby, forming a fin structure 410 comprising silicon. In exemplary implementations, the width of fin structure 410 may range from about 70 Å to about 80 Å. In one implementation, the width of fin structure 410 may be approximately 75 Å.

After the formation of fin structure 410, source and drain regions may be formed adjacent the respective ends of fin structure 410. For example, in an exemplary implementation, a layer of silicon, germanium or combination of silicon and germanium may be deposited, patterned and etched in a conventional manner to form source and drain regions. Alternatively, silicon layer 130 may be patterned and etched to form source and drain regions. FIG. 4B illustrates an exemplary top view of semiconductor device 100 including source region 420 and drain region 430 formed adjacent fin structure 410 on buried oxide layer 120. The buried oxide layer and the photoresist mask are not illustrated in FIG. 4B for simplicity.

Figure 5:
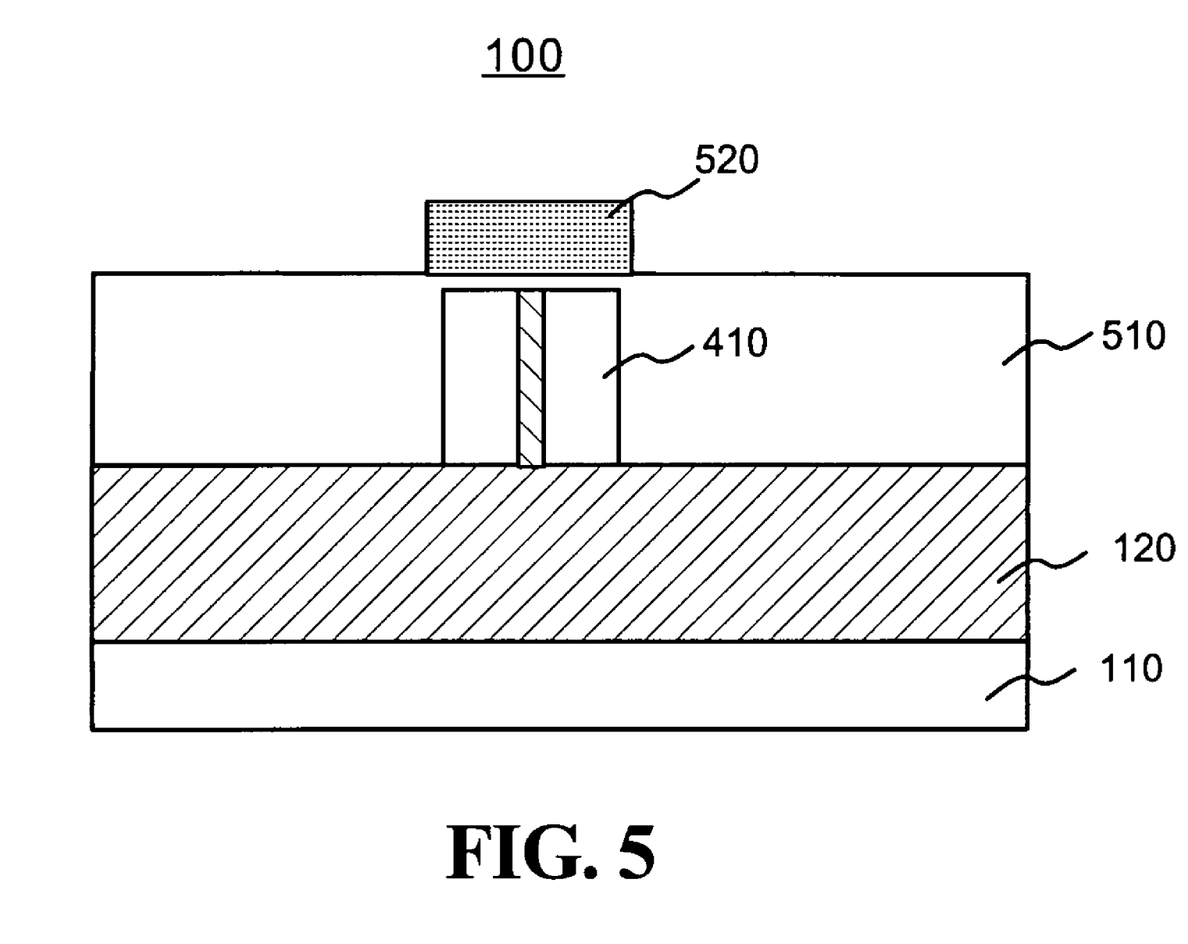

Photoresist mask 310 may then be removed, as shown in FIG. 5, and a dielectric layer 510 may be formed in a conventional manner over fin structure 410. In one implementation, for example, an oxide (or other material) may be deposited over fin structure 410 to form dielectric layer 510. The thickness of dielectric layer 510 may range from about 50 Å to about 300 Å.

Figure 6:
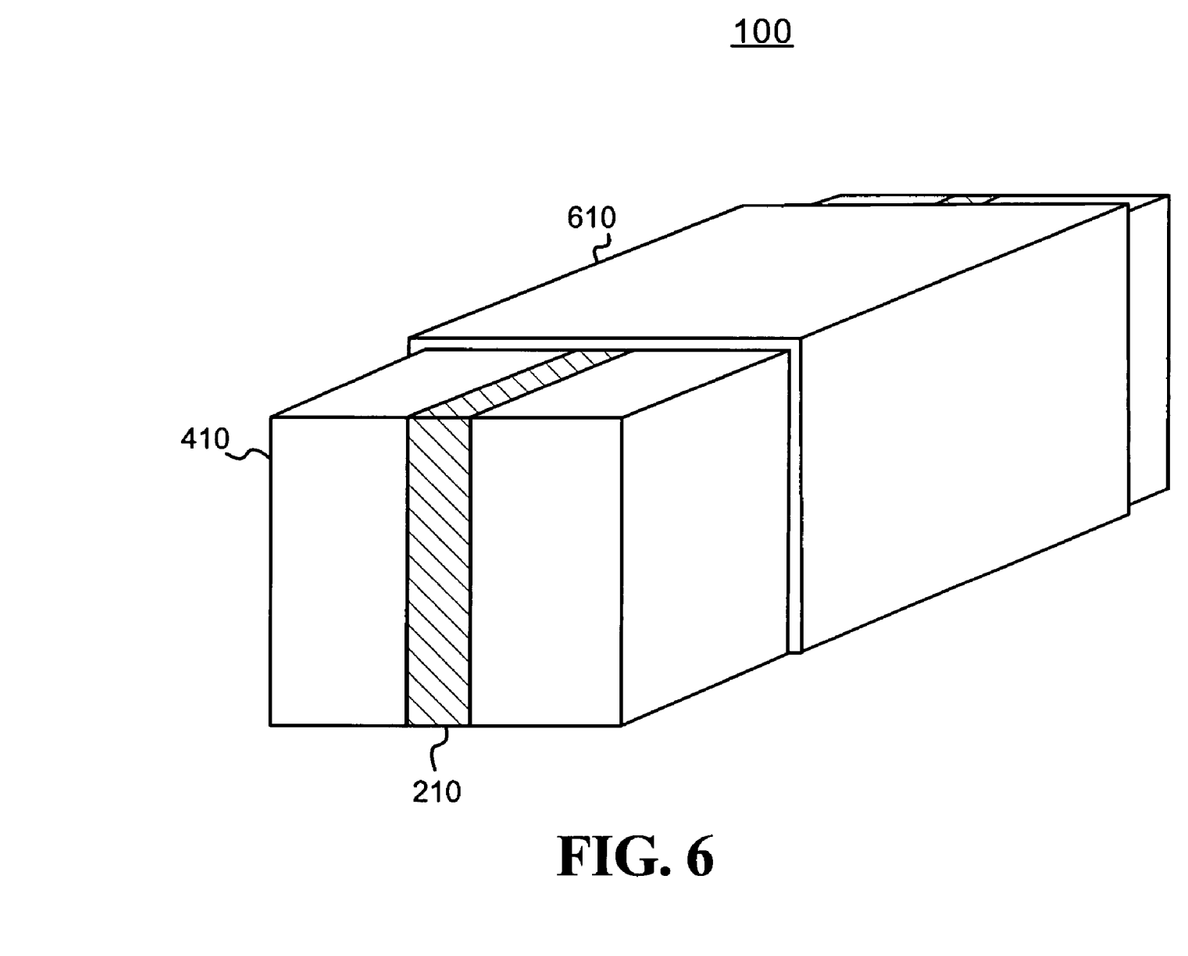

A photoresist material may be deposited and patterned to form another photoresist mask 520, as illustrated in FIG. 5. The photoresist material may be deposited and patterned in any conventional manner. Dielectric layer 510 may then be etched to form a gate dielectric 610 around portions of fin structure 410, as illustrated in FIG. 6. In one implementation, dielectric layer 510 may be etched in a conventional manner, with the etching terminating on buried oxide layer 120. The portion of dielectric layer 510 located under photoresist mask 520 will not be etched, thereby, forming gate dielectric 610. In exemplary implementations, the thickness of gate dielectric 610 may range from about 50 Å to about 300 Å.

Figure 7A:
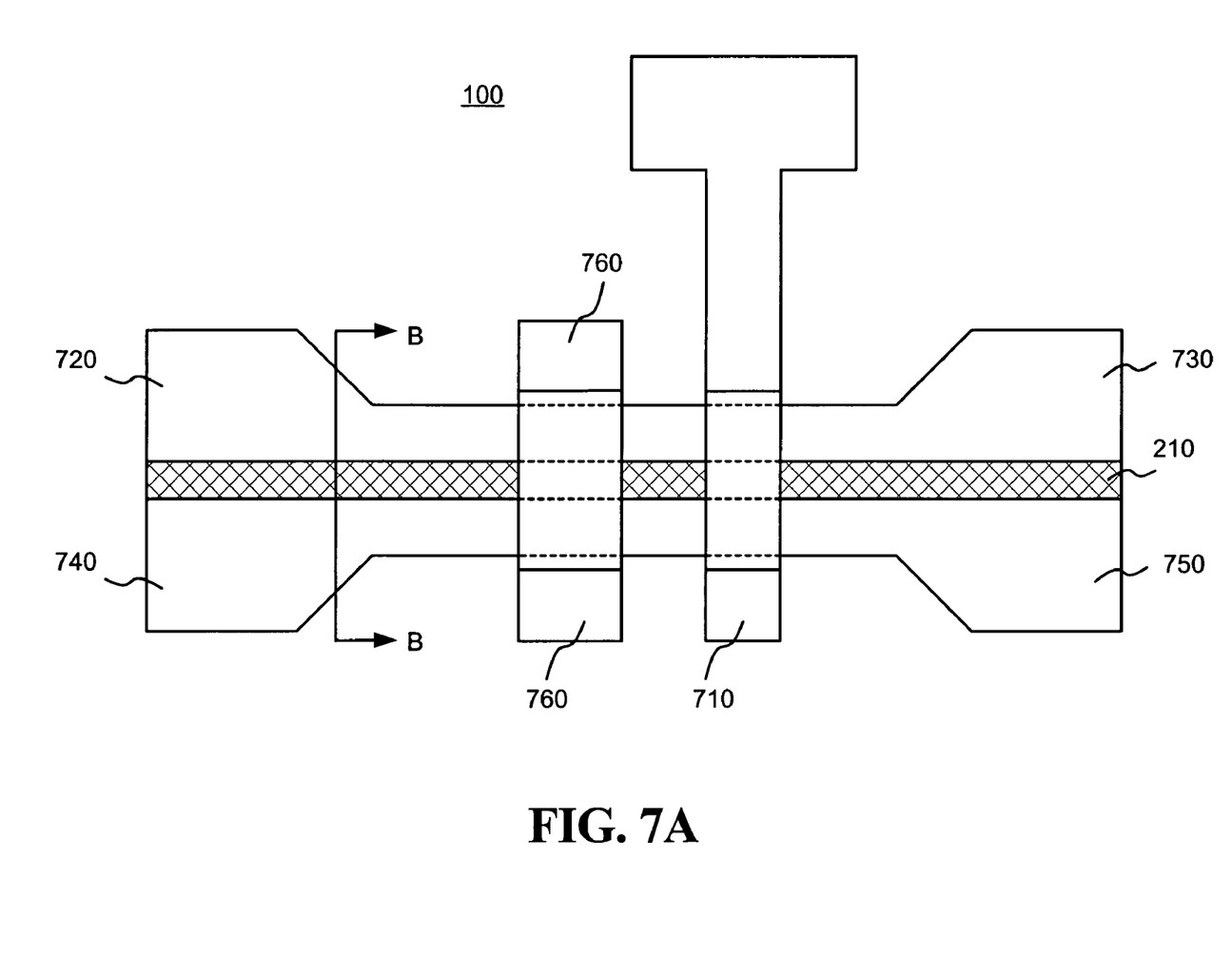
Figure 7B:
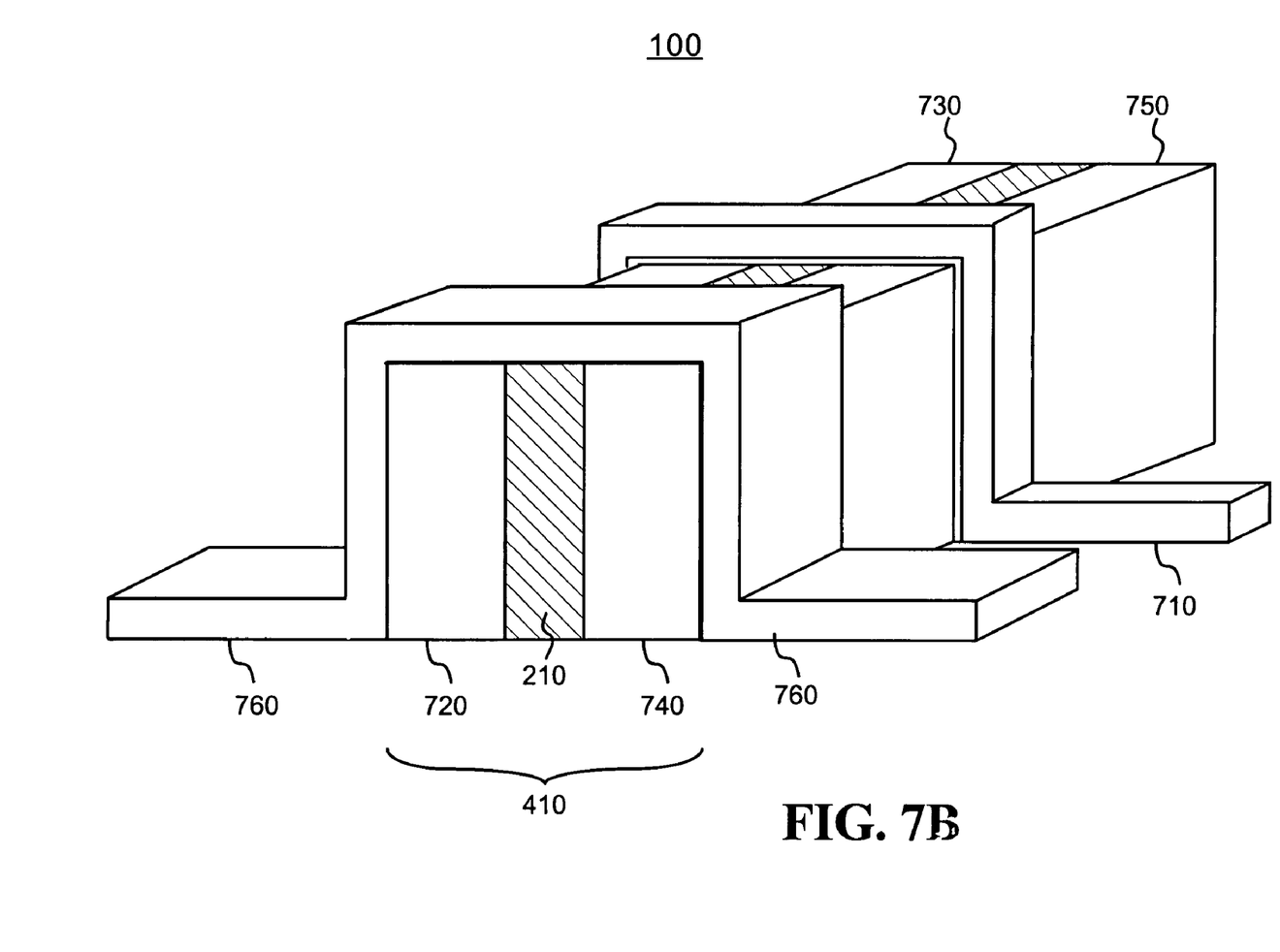

A layer of material may then be deposited and etched to form one or more gate electrodes 710, and one or more contacts 760, as illustrated in FIGS. 7A and 7B. In an exemplary implementation, the layer of material may include polysilicon deposited using conventional chemical vapor deposition (CVD) to a thickness ranging from about 200 Å to about 500 Å. Alternatively, other semiconducting materials, such as germanium or combinations of silicon and germanium, or various metals may be used as the gate material. In one implementation, the layer of material may be patterned and etched to form one or more gate electrodes 710 that surround top and side surfaces of fin structure 410, and one or more contacts 760 that contact side surfaces of fin structure 410.

As illustrated in FIG. 7A, retrograde channel stop layer 210 causes two separate source regions 720 and 740 to be formed, along with two separate drain regions 730 and 750. In this way, an N-channel transistor device can be formed on one side of retrograde channel stop layer 210 (e.g., including source region 740 and drain region 750) and a P-channel transistor device can be formed on the opposite side of retrograde channel stop layer 210 (e.g., including source region 720 and drain region 730). FIG. 7B illustrates an exemplary three-dimensional view of semiconductor device 100 of FIG. 7A. The view illustrated in FIG. 7B is taken along line BB in FIG. 7A.

Source/drain regions 720, 730, 740, and 750 may then be doped with n-type or p-type impurities based on the particular end device requirements. In exemplary implementations consistent with the principles of the invention, source region 720 and drain region 730 of the P-channel device may be doped with p-type impurities and source region 740 and drain region 750 of the N-channel device may be doped with n-type impurities.

Figure 8:
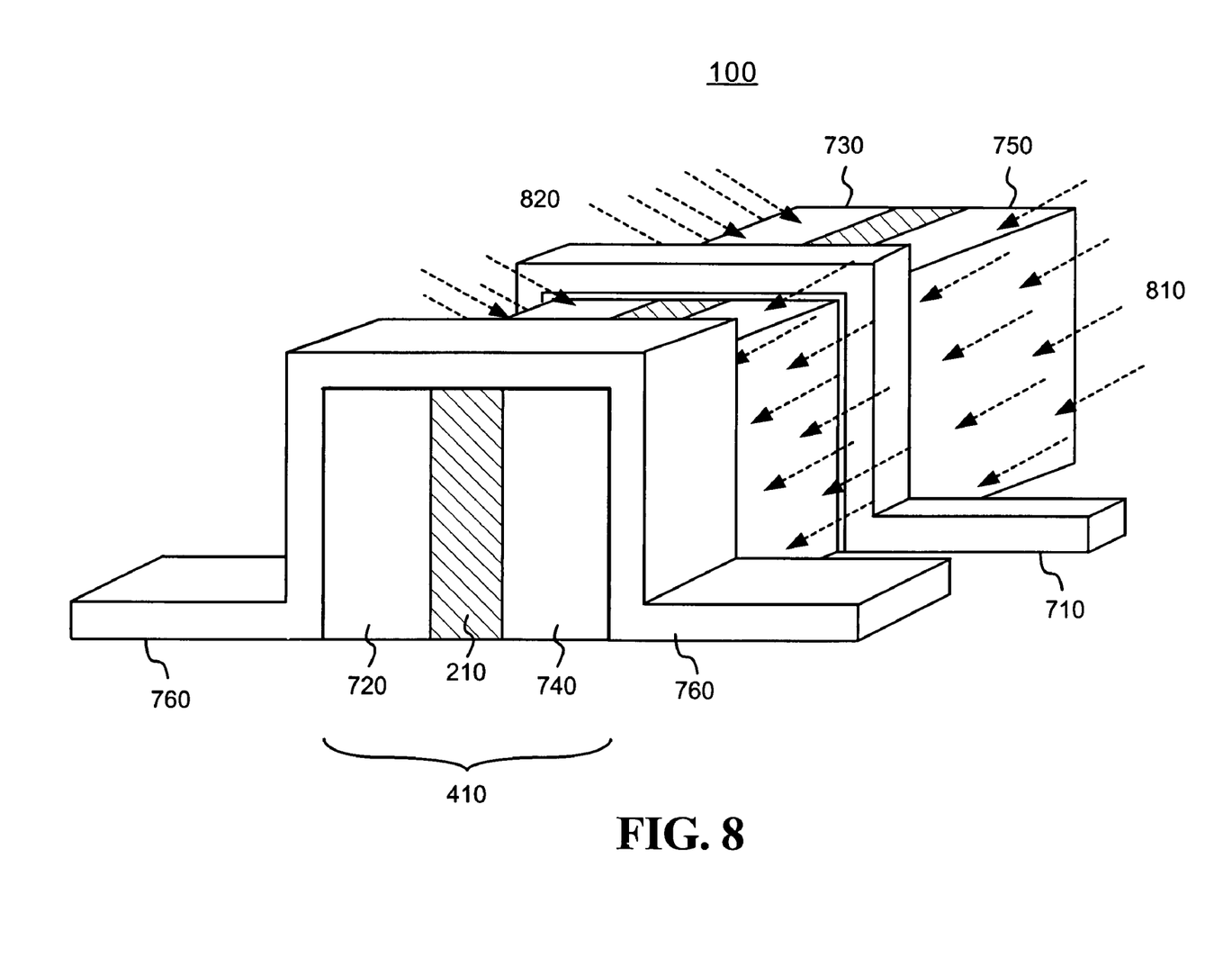

For example, a conventional implant process of n-type impurities, such as arsenic or phosphorus, may be performed to dope source region 740 and drain region 750, as illustrated in FIG. 8. The n-type impurities 810 may be implanted at a tilt angle ranging from approximately 10 degrees to 80 degrees. In an exemplary implementation, the implant process may be performed at an angle of approximately 30 degrees. Using a tilt angle ensures that source and drain regions 720 and 730 will not be doped during this first ion implantation process.

In an exemplary implementation, phosphorus may be implanted at a dosage of about $5 \times 10^{14}$ atoms/cm$^2$ to about $1 \times 10^{15}$ atoms/cm$^2$ and an implantation energy of about 3 KeV to about 6 KeV, which may depend on the thickness of source region 740 and drain region 750 and the desired junction depths for source/drain regions 740 and 750. In an alternative implementation, arsenic may be implanted at a dosage of about $5 \times 10^{14}$ atoms/cm$^2$ to about $1 \times 10^{15}$ atoms/cm$^2$ and an implantation energy of about 5 KeV to about 10 KeV, which may depend on the thickness of source region 740 and drain region 750 and the desired junction depths for source/drain regions 740 and 750.

A tilt angle implant process of p-type impurities, such as boron or BF$_2$, may be performed to dope source region 720 and drain region 730, as further illustrated in FIG. 8. The p-type impurities 820 may be implanted at an angle ranging from approximately 10 degrees to 80 degrees. In an exemplary implementation, the implant process may be performed at an angle of approximately 30 degrees.

The p-type impurities 820 may be implanted at a dosage of about $5 \times 10^{14}$ atoms/cm$^2$ to about $1 \times 10^{15}$ atoms/cm$^2$ and an implantation energy of about 2 KeV to about 3 KeV, which may depend on the thickness of source region 720 and drain region 730 and the desired junction depths for source/drain regions 720 and 730. The above implant processes may alter the work function of gate 710 in the N-channel region and the P-channel region to achieve desirable threshold voltages for the resulting N-channel and P-channel devices. Channel stop layer 210 may further create a retrograde channel concentration profile that confines a depletion region of the P/N junction formed between the P-channel of source/drain regions 720 and 730 and the N-channel of source/drain regions 740 and 750. Control of the depletion region between the P-channel and the N-channel devices results in forward diode isolation between the channels, thus, preventing a short.

It will be appreciated that sidewall spacers may optionally be formed prior to the source/drain ion implantation processes described above to control the location of the source/drain junctions based on the particular circuit requirements. Activation annealing may then be performed to activate source/drain regions 720/730 and 740/750.

Figure 9:
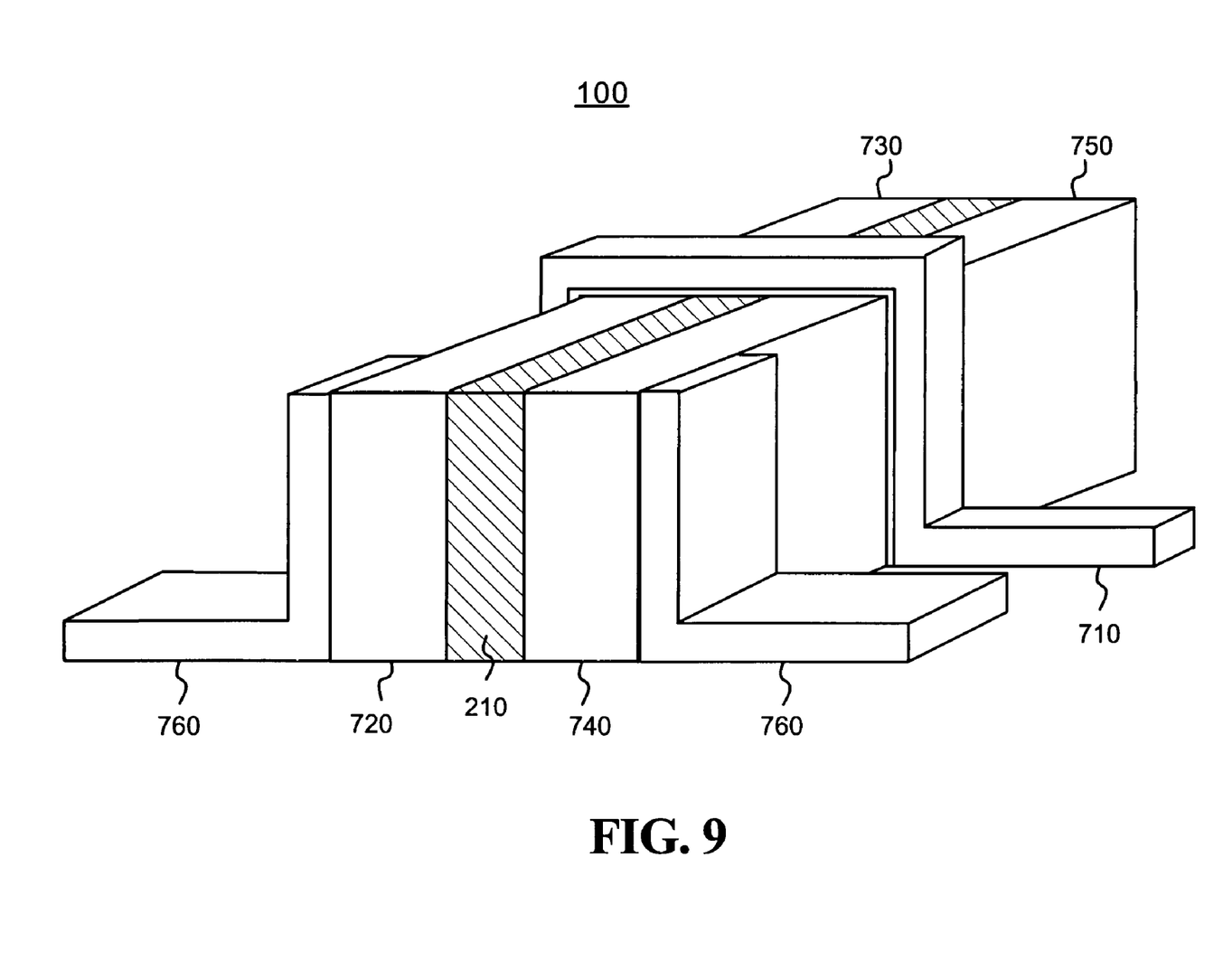
Figure 10:
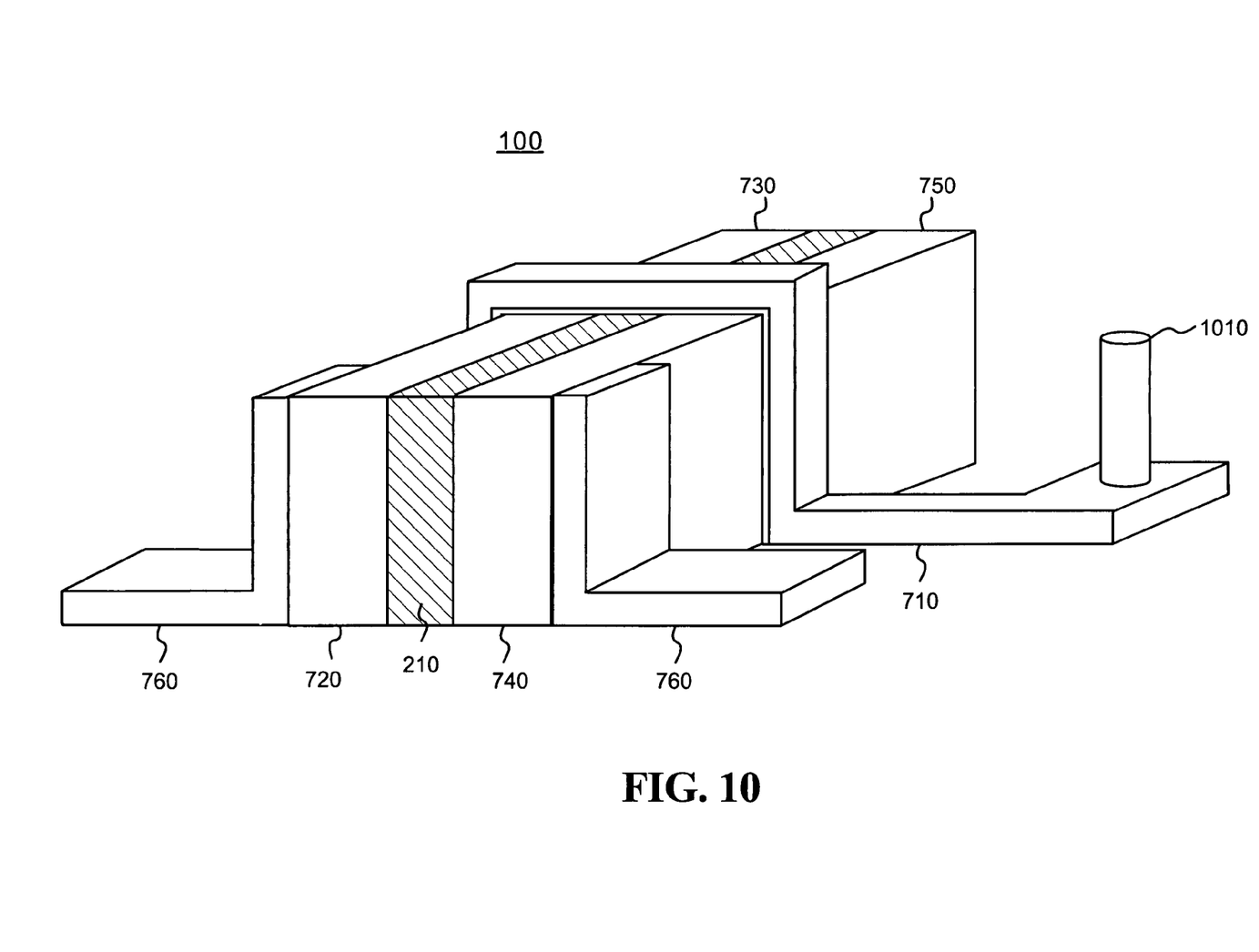

As a result of the above processing, an N-channel/P-channel transistor pair may be formed, having a common gate 710 and independent source regions 720 and 740 and drain regions 730 and 750. As illustrated in FIG. 9, the polysilicon may also be selectively removed from contacts 760 in the source region of semiconductor device 100. Once the polysilicon is selectively removed, a polysilicon contact 760 may be formed on both sides of semiconductor device 100 in the source region. A self-aligned silicide (salicide) process may then be performed for contact 760. For example, a metal may be deposited on contact 760, followed by an annealing to form a metal-silicide layer on contact 760. As further shown in FIG. 10, an interconnect 1010 may be further be formed with gate 710.

Figure 11:
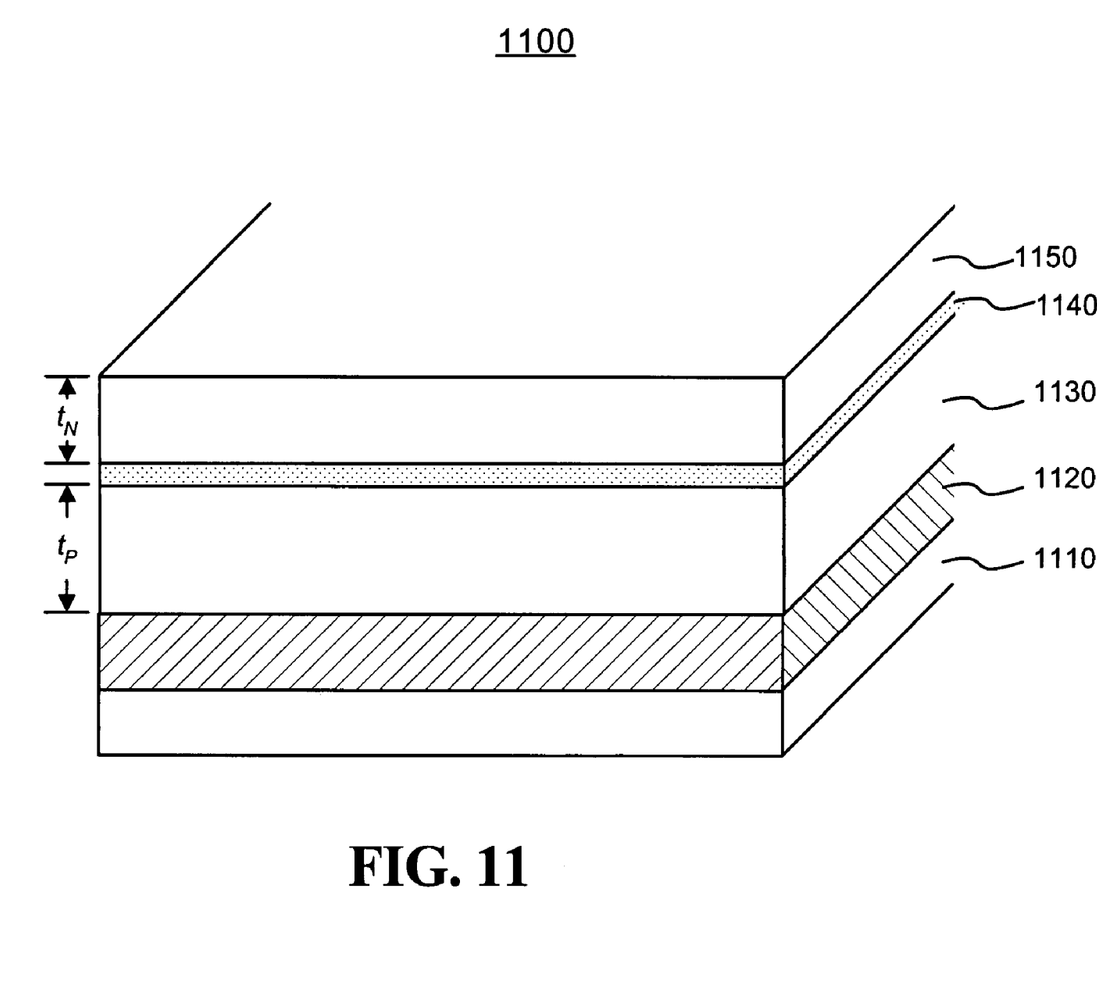
FIGS. 11–12 illustrate exemplary views of a stacked fin fabrication process according to an alternative implementation consistent with the principles of the invention.

FIG. 11 illustrates a view of an exemplary semiconductor device 1100 that includes a silicon-on-insulator (SOI) structure having a silicon substrate 1110, a buried oxide layer 1120, a first semiconducting layer 1130 on buried oxide layer 1120, an insulating layer 1140, and a second semiconducting layer 1150. Buried oxide layer 1120, semiconducting layers 1130 and 1150, and insulating layer 1140 may be formed on substrate 1110 in a conventional manner.

In an exemplary implementation, buried oxide layer 1120 may include silicon oxide and may have a thickness ranging from about 1500 Å to about 3000 Å. Semiconducting layer 1130 may include monocrystalline or polycrystalline silicon having a thickness of $t_N$. Semiconducting layer 1150 may include monocrystalline or polycrystalline silicon having a thickness of $t_p$, where $t_{N \neq p}$. Insulating layer 1140 may include, for example, any dielectric material that will insulate layers 1130 and 1150 from one another. Layers 1130, 1140 and 1150 may be used to form a fin structure, as described in more detail below.

In alternative implementations consistent with the present invention, substrate 1110 and layers 1130 and 1150 may include other semiconducting materials, such as germanium, or combinations of semiconducting materials, such as silicon-germanium. Buried oxide layer 1120 may also include other dielectric materials.

Figure 12:
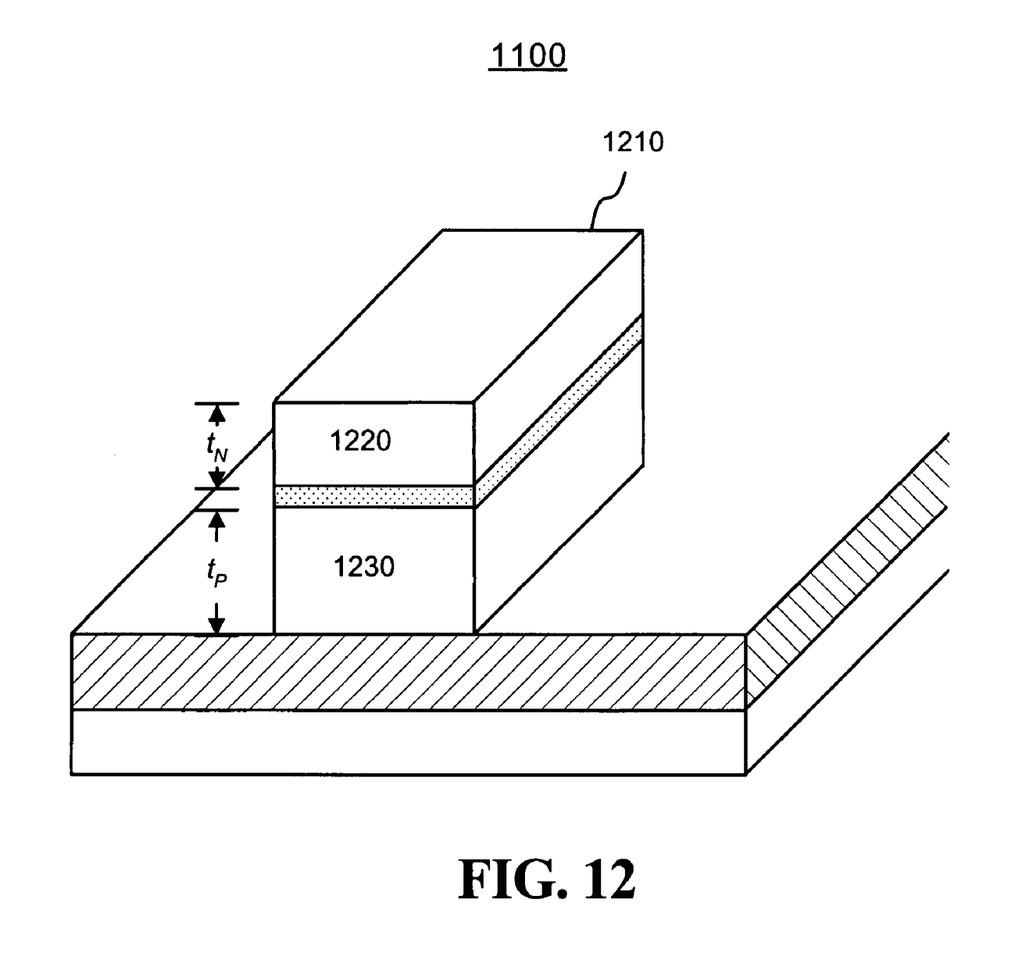

As shown in FIG. 12, semiconductor device 1100 may be etched, for example, to form a fin structure 1210 from layers 1130, 1140 and 1150. Fin structure 1210 may include a first channel 1220 and a second channel 1230. The first channel 1220 may include, for example, a N-channel and the second channel 1230 may include, for example, a P-channel. The relative heights (i.e., thicknesses) of the first channel 1220 versus the second channel 1230 may be selected to set the P/N junction drain saturation current ($I_{DSAT}$) ratio. The drain saturation current ratio may, thus, be controlled in a variable fashion by the relative thicknesses ($t_N$ & $t_p$) of the first 1220 and second 1230 channels. In some implementations, for example, the thicknesses of first channel 1220 and second channel 1230 may be selected such that the current for each channel is matched. Subsequent to formation of fin structure 1210, a FinFET gate (not shown) may then be formed, in a conventional manner, over fin structure 1210 to create a FinFET transistor.

CONCLUSION

Implementations consistent with the principles of the invention merge N-channel and P-channel FinFET devices on a single fin structure. As a result, increased density for complimentary FinFET structures can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with respect to FIGS. 1–12, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A semiconductor device comprising:
   a fin structure comprising a semiconducting material, the fin structure including a channel stop layer, wherein the channel stop layer has a retrograde channel concentration profile;
   a source region formed at one end of the fin structure, the channel stop layer separating the source region into a first source region and a second source region;
   a drain region formed at an opposite end of the fin structure, the channel stop layer separating the drain region into a first drain region and a second drain region; and
   at least one gate.

2. The semiconductor device of claim 1, wherein the retrograde channel concentration profile confines a depletion region of a junction formed between the first source region and the second source region and between the first drain region and the second drain region.

3. The semiconductor device of claim 1, wherein the channel stop layer comprises ions implanted into the fin structure at a selected concentration and at a selected implantation energy level.

4. The semiconductor device of claim 1, wherein the first source region and the first drain region are formed on a first side of the retrograde channel stop layer and the second source region and the second drain region are formed on an opposite side of the channel stop layer.

5. The semiconductor device of claim 4, wherein the first source region and the first drain region are part of an N-channel device, and
wherein the second source region and the second drain region are part of a P-channel device.

6. The semiconductor device of claim 5, wherein each of the N-channel device and the P-channel device includes the at least one gate.

7. A semiconductor device, comprising:
a fin structure that includes a retrograde channel stop layer that extends a length of the fin structure and is positioned approximately in a center of the fin structure;
a source region formed at one end of the fin structure the retrograde channel stop layer separating the source region into a first source region and a second source region; and
a drain region formed at an opposite end of the fin structure the retrograde channel stop layer separating the drain region into a first drain region and a second drain region, wherein the retrograde channel stop layer has a retrograde channel concentration profile.

8. The semiconductor device of claim 7, wherein the retrograde channel concentration profile confines a depletion region of a junction formed between the first source region and the second source region and between the first drain region and the second drain region.

9. The semiconductor device of claim 7, wherein the retrograde channel stop layer comprises ions implanted into the fin structure at a selected concentration and a selected implantation energy level.

10. The semiconductor device of claim 7, further comprising at least one gate formed over the fin structure.

11. The semiconductor device of claim 7, wherein a width of the fin structure ranges from about 70 Å to about 80 Å.

12. The semiconductor device of claim 7, wherein the first source region and the first drain region are formed on a first side of the retrograde channel stop layer and the second source region and the second drain region are formed on an opposite side of the retrograde channel stop layer.

13. The semiconductor device of claim 12 wherein the first source region and the first drain region are part of an N-channel device, and
wherein the second source region and the second drain region are part of a P-channel device.

14. The semiconductor device of claim 7, wherein the first source and drain regions are doped with n-type impurities and the second source and drain regions are doped with p-type impurities, and
wherein the semiconductor device further comprises:
a common gate formed on at least a top and one side surface of the fin structure.

15. A semiconductor device comprising:
an N-channel device including a first source region a first drain region, a first fin structure and a gate; and
a P-channel device including a second source region, a second drain region, a second fin structure and the gate the second source region the second drain region and the second fin structure being separated from the first source region, the first drain region, and the first fin structure by a channel stop layer, wherein the channel stop layer has a retrograde channel concentration profile.

16. The device of claim 15, wherein the retrograde channel concentration profile confines a depletion region of a junction formed between the first source region and the second source region and between the first drain region and the second drain region.

17. The device of claim 15, wherein the channel stop layer comprises ions implanted into the semiconductor device at a selected concentration and a selected implantation energy level.

* * * * *

UNITED STATES PATENT AND TRADEMARK OFFICE
CERTIFICATE OF CORRECTION

PATENT NO.       : 6,974,983 B1
APPLICATION NO.  : 10/768660
DATED            : December 13, 2005
INVENTOR(S)      : Wiley Eugene Hill et al.

It is certified that error appears in the above-identified patent and that said Letters Patent is hereby corrected as shown below:

Col. 7 at line 5, insert a comma after the word "structure"
Col. 7 at line 10, insert a comma after the word "structure"
Col. 8 at line 2, insert a comma after the word "region"
Col. 8 lines 5 and 6 should be rewritten as:  --second drain region, a second fin structure, and the gate, the second source region, the second drain region, and--

Signed and Sealed this

Nineteenth Day of September, 2006

JON W. DUDAS
*Director of the United States Patent and Trademark Office*